(12) United States Patent
Song et al.

(10) Patent No.: US 11,205,937 B2
(45) Date of Patent: Dec. 21, 2021

(54) DRIVING SYSTEM HAVING REDUCED VIBRATION TRANSMISSION

(71) Applicant: ASM Technology Singapore Pte Ltd, Singapore (SG)

(72) Inventors: Keng Yew Song, Singapore (SG); Ka Shing Kwan, Singapore (SG); Yue Zhang, Singapore (SG); Xiao Liang Chen, Singapore (SG); Chu Fan Feng, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 700 days.

(21) Appl. No.: 16/038,385

(22) Filed: Jul. 18, 2018

(65) Prior Publication Data

US 2020/0028407 A1 Jan. 23, 2020

(51) Int. Cl.
*H02K 5/24* (2006.01)
*H02K 41/035* (2006.01)
*H01L 23/00* (2006.01)

(52) U.S. Cl.
CPC .............. *H02K 5/24* (2013.01); *H01L 24/78* (2013.01); *H02K 41/0354* (2013.01); *H01L 2224/78735* (2013.01); *H02K 2201/18* (2013.01)

(58) Field of Classification Search
CPC ........... H01L 2924/00014; H01L 21/50; H01L 2924/01033; H01L 2924/01023; H01L 2224/78; H01L 2924/01013; H01L 2924/01029; H01L 2924/01082; H01L 2924/01005; H01L 2924/01006; H01L 2224/48; H01L 2224/45099; H01L 2224/05599; H02K 7/00; Y10T 156/17; Y10T 156/1702
See application file for complete search history.

(56) References Cited

U.S. PATENT DOCUMENTS

| 4,525,659 A | 6/1985 | Imahashi ...................... 318/649 |
| 5,219,112 A | 6/1993 | Mochida et al. ............. 228/4.5 |

(Continued)

FOREIGN PATENT DOCUMENTS

| CN | 102522356 B | 3/2015 |
| JP | H 4-332145 A | 11/1992 |
| JP | 2003-240050 A | 8/2003 |

OTHER PUBLICATIONS

Korean Notice of Preliminary Rejection, dated Dec. 24, 2020, issued in corresponding Korean Patent Application No. 10-2019-0084988. English translation. Total 10 pages.

(Continued)

*Primary Examiner* — Tran N Nguyen
*Assistant Examiner* — Leda T Pham
(74) *Attorney, Agent, or Firm* — Ostrolenk Faber LLP (57) ABSTRACT

A driving system has a driving motor body operative to produce a driving force for driving an object to move in reciprocating directions. A pivotal support is located between the driving motor body and a machine base for supporting the driving motor body on the machine base. The pivotal support causes at least a portion of the driving motor body to rotate relative to the machine base in an opposite direction to a direction of the driving force produced by the driving motor body to drive the object, so as to reduce vibration transmission to the machine base.

15 Claims, 6 Drawing Sheets

(56) References Cited

U.S. PATENT DOCUMENTS

| | | | | |
|---|---|---|---|---|
| 6,727,666 B2* | 4/2004 | Kyomasu | ............ | H01L 21/6835 |
| | | | | 310/12.05 |
| 7,405,500 B2* | 7/2008 | Maeda | .............. | H01L 21/67138 |
| | | | | 228/4.5 |
| 8,288,898 B2* | 10/2012 | Jun | ......................... | H02K 33/16 |
| | | | | 310/13 |
| 10,236,761 B2* | 3/2019 | Wang | ...................... | H02K 33/16 |
| 10,483,451 B2* | 11/2019 | Wang | ...................... | H01L 41/09 |
| 2011/0315743 A1 | 12/2011 | Maruya et al. | ............... | 228/102 |

OTHER PUBLICATIONS

Search Report dated Dec. 12, 2019 issued in corresponding Taiwan Patent Application No. 108121611.

* cited by examiner

Center Position

FIG. 6A

Off-Center Position

12 # DRIVING SYSTEM HAVING REDUCED VIBRATION TRANSMISSION

FIELD OF THE INVENTION

The invention relates to a driving system for operating components on a machine, such as a wire bonder, and in particular, to a driving system that reduces vibration generated by the driving system that is transmitted to other parts of the machine.

BACKGROUND AND PRIOR ART

When driving components on a machine with a motor, reaction forces will typically be generated from such driving motion and are transferred to a base of the machine. The reaction forces will cause vibration in the motion direction, and this may affect the motion accuracy of the component that is driven.

Figure 1:
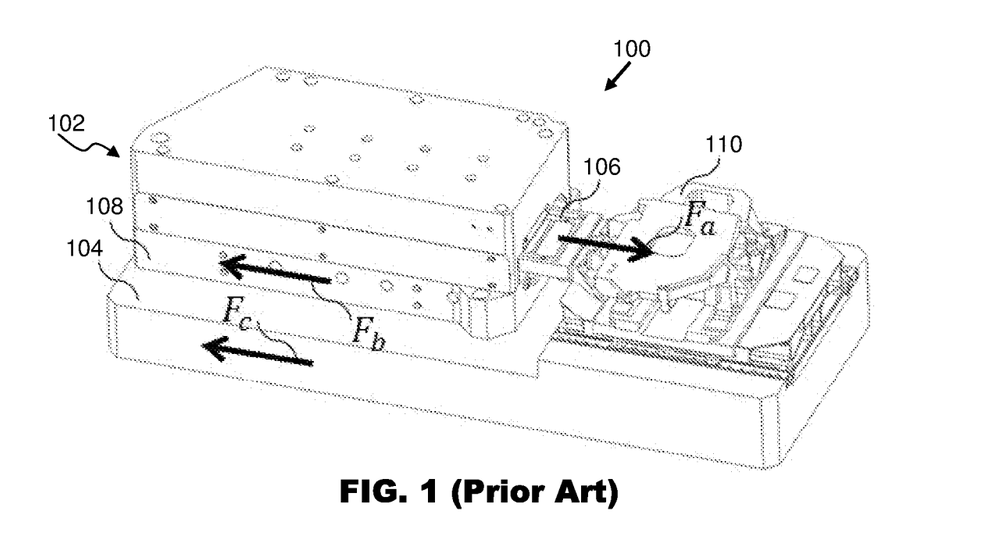
FIG. 1 is an isometric view of a conventional linear motor assembly.

To illustrate this, FIG. 1 is an isometric view of a conventional linear motor assembly 100, such as that found in a wire bonder. A driving motor body 102 of the conventional linear motor assembly 100 is directly mounted on a machine base 104. When a motor driving coil 106 electromagnetically interacts with a motor driving magnet 108 to drive a bond head support 110 with a motor driving force Fa, a motor body reaction force Fb opposite to the motor driving force Fa will be directly transferred to the machine base as a machine base reaction force Fc. Generally, Fc=Fb=Fa.

The machine base reaction force Fc will cause the machine to vibrate along the motion direction of the motor driving force Fa (see FIG. 1). Hence, the accuracy of the motion may be adversely affected, especially from high-speed driving motions.

One way to reduce the reaction force is described in U.S. Pat. No. 6,727,666 entitled "XY Table for a Semiconductor Manufacturing Apparatus", wherein a motor base of a motor is adapted to be movable in an opposite linear direction to the driven body, so as to cancel the reaction force generated.

Another similar approach is described in Chinese Patent Number CN102522356B entitled "Linear Platform of Double-shaft Floating Stator", wherein an XY motor base of an XY motion platform is movable in an opposite linear direction to a driver, so that the reaction force will not be transferred to the XY motion platform. A spring damping system is also added to constrain the movement of the motion body.

Such approaches as described above typically minimize vibratory influence by using rollers to enable the driving motor body 102 to be movable in an opposite linear direction to the motor driving force Fa. This helps to cancel or minimize the reaction force Fb that is transferred to the machine base 104. However, in actual operation, a spring damping system would have to be added to prevent the driving motor body 102 from moving out of an effective electromagnetic interaction area between the motor driving coil 106 and the motor driving magnet 108. Such a spring damping system will still cause a large part of the motor body reaction force Fb to be transferred to the machine base 104 parallel to the direction of application of the motor driving force Fa, via a spring force from the spring damping system. Hence, the motion accuracy of the conventional linear motor assembly 100 would still be adversely affected.

SUMMARY OF THE INVENTION

It is thus an object of the invention to seek to reduce the transfer of vibration from a component driving motion in a machine body while avoiding the shortcomings of the aforesaid prior art.

Accordingly, the invention provides a driving system for reducing vibration transmission from a driving motor to a machine base, the driving system comprising: a driving motor body operative to produce a driving force for driving an object to move in reciprocating directions; a pivotal support for supporting the driving motor body, the pivotal support being located between the driving motor body and the machine base; wherein the pivotal support is operative to cause at least a portion of the driving motor body to rotate relative to the machine base in an opposite direction to a direction of the driving force produced by the driving motor body to drive the object.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary driving system offering reduced vibration transmission in accordance with the invention will now be described with reference to the accompanying drawings, in which:

FIGS. 9A to 12B are different examples of resilient structures that may be used in the invention for mounting a driving motor body to achieve a rotary motion of the driving motor body.

DETAILED DESCRIPTION OF THE PREFERRED EMBODIMENT OF THE INVENTION

Figure 2A:
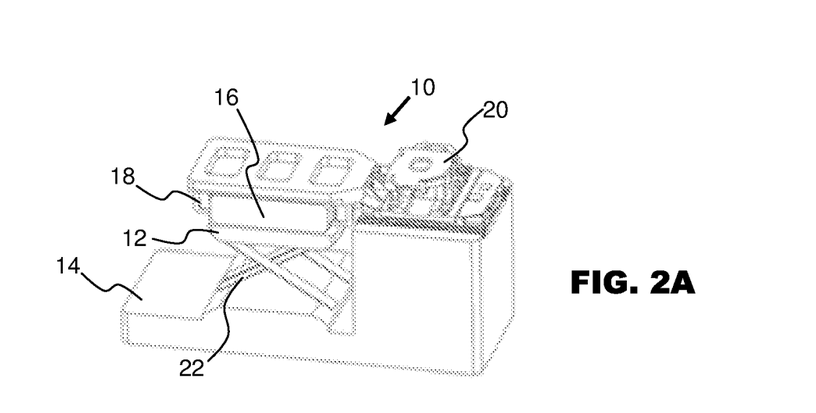
FIGS. 2A and 2B are isometric and side views respectively of a motor driving system according to a first preferred embodiment of the invention.
Figure 2B:
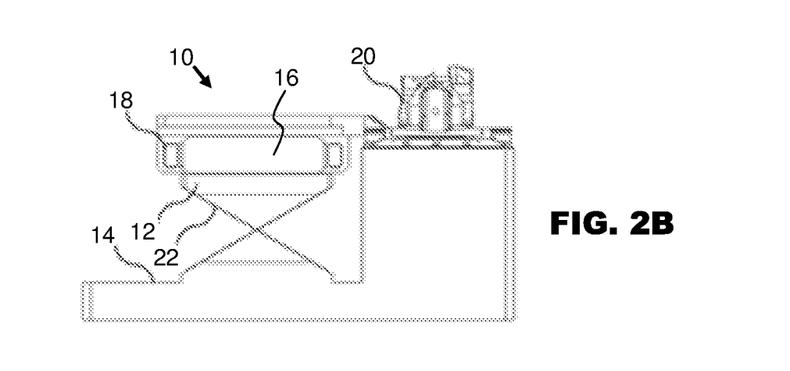

FIGS. 2A and 2B are isometric and side views respectively of a motor driving system 10 according to a first preferred embodiment of the invention, such as that found in a wire bonder. A driving motor body 12 of the motor driving system 10 is driven to move by electromagnetic interaction between a motor driving coil 16 and a motor driving magnet 18. The driving motor body 12 is in turn operative to produce a driving force for driving and controlling a position of an object, such as a bond head support 20 attached to the driving motor body 12. The object is generally driven to move in reciprocating directions.

Instead of being directly mounted on a machine base 14 of the motor driving system 10, a pivotal support comprising a resilient structure, which may be in the form of a cross-shaped leaf spring assembly 22, is used to connect the driving motor body 12 and the machine base 14. The function of the resilient structure located between the driving motor body 12 and the machine base 14 is primarily to make at least a portion of the driving motor body 12 rotatable relative to the machine base 14. Such a configuration of the motor driving system 10 enables the reduction of vibration transmission from the motor body 12 to the machine base 14.

The resilient structure is operative to cause at least a portion of the driving motor body 12, in this case either the motor driving coil 16 or the motor driving magnet 18, to rotate relative to the machine base 14 in an opposite direction to a direction of the driving force produced by the driving motor body 12 to drive the bond head support 20. The cross-shaped leaf spring assembly 22 is therefore arranged and configured to incorporate a rotational pivot point such that at least a portion of the driving motor body 12 is rotatable relative to the machine base 14 about the rotational pivot point. In this embodiment, the cross-shaped leaf spring assembly 22 comprises a pair of leaf springs and the rotational pivot point may be an actual pivot point located at a position where the respective leaf springs intersect each other.

Figure 3A:
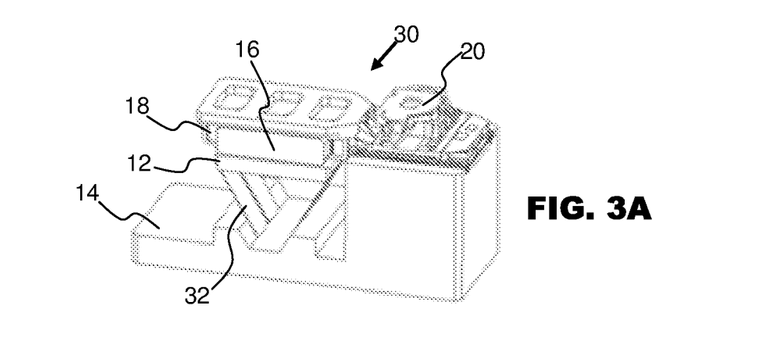
FIGS. 3A and 3B are isometric and side views respectively of a motor driving system according to a second preferred embodiment of the invention.
Figure 3B:
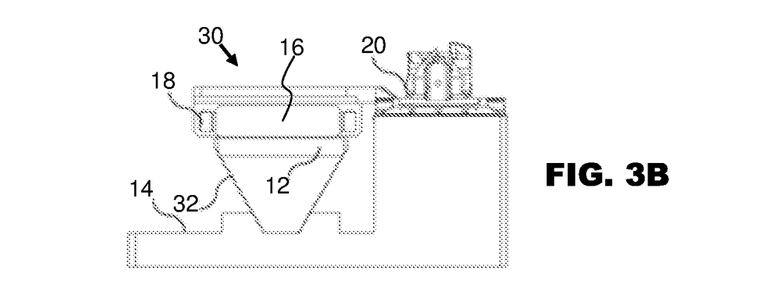

It should be appreciated that such a resilient structure rotational pivot point may have different designs for connecting the driving motor body 12 to the machine base 14. FIGS. 3A and 3B are isometric and side views respectively of a motor driving system 30 according to a second preferred embodiment of the invention. In this embodiment, the resilient structure is in the form of a generally V-shaped leaf spring assembly 32 comprising a pair of leaf springs, a base of the V-shape being located at the machine base 14. Thus, the V-shaped lead spring assembly 32 forms a virtual rotational pivot point for rotation of the driving motor body 12.

Figure 4A:
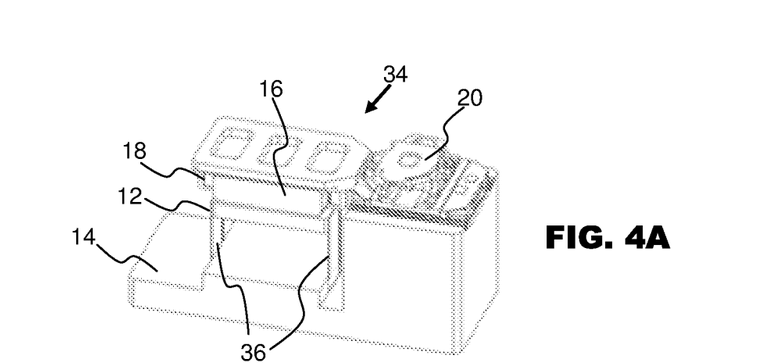
FIGS. 4A and 4B are isometric and side views respectively of a motor driving system according to a third preferred embodiment of the invention.
Figure 4B:
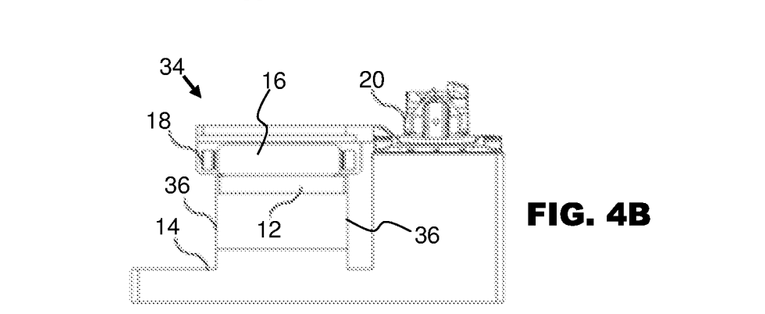

FIGS. 4A and 4B are isometric and side views respectively of a motor driving system 34 according to a third preferred embodiment of the invention. In this embodiment, the resilient structure is in a form of a pair of vertically-arranged leaf springs 36 connecting opposite ends of the driving motor body 12 to corresponding positions on the machine base 14. The pair of vertically-arranged leaf springs 36 will result in an infinite pivot which allows at least a portion of the driving motor body 12 to rotate relative to the machine base 14.

Figure 5:
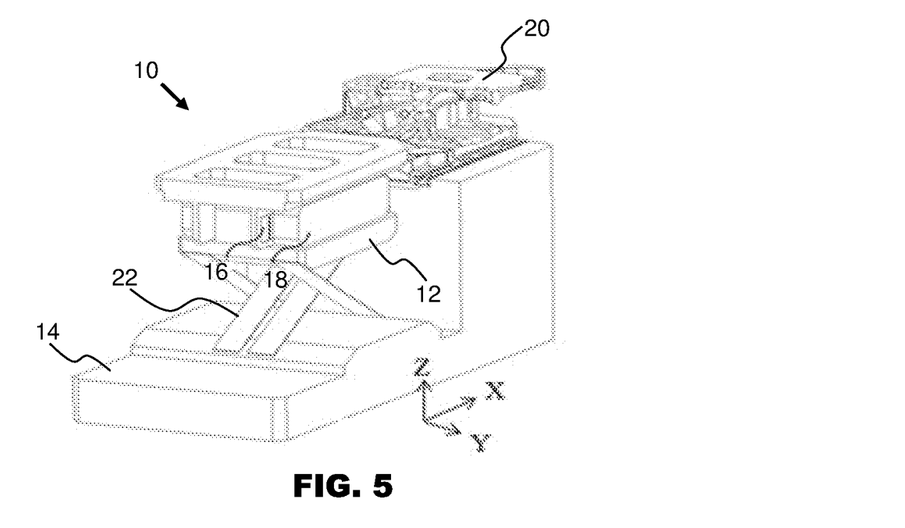
FIG. 5 is an isometric view of a front side of the motor driving system according to the first preferred embodiment of the invention.

FIG. 5 is an isometric view of a front side of the motor driving system 10 according to the first preferred embodiment of the invention.

As shown in FIG. 5, at least a portion of the driving motor body 12 will rotate along an XZ plane upon the application of a motor driving force. The motor driving coil 16 and the motor driving magnet 18 should be arranged with sufficient space in directions parallel to the XZ plane in order to maintain a gap between the motor driving coil 16 and the motor driving magnet 18 to be substantially constant even during rotational motion of either component of the driving motor body 12. Depending on whether the motor driving system 10 is designed with a moving motor driving coil 16 or a moving driving magnet 18 which is configured to rotate with respect to the machine base 14, the bond head support 20 may be connected to either one of the movable driving parts in order to be driven to move.

Figure 6A:
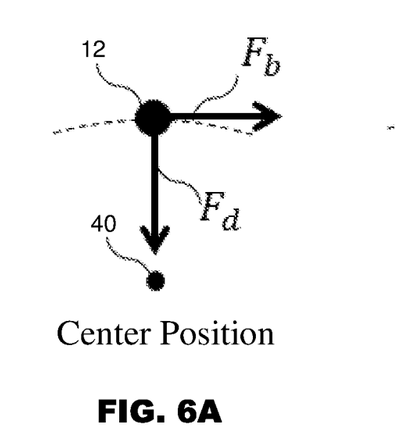
FIGS. 6A and 6B are schematic illustrations of a force analysis of a motor driving system according to the preferred embodiments of the invention upon application of a driving force.
Figure 6B:
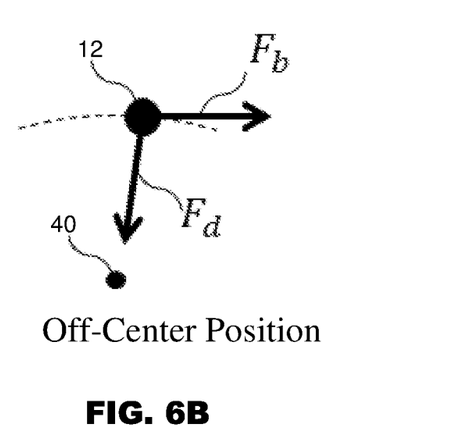

FIGS. 6A and 6B are schematic illustrations of a force analysis of a motor driving system 10 according to the preferred embodiments of the invention upon application of a driving force. In FIG. 6A, a motor body reaction force $F_b$ is created when a driving force (not illustrated) is applied on the driving motor body 12. Due to rotation of the driving motor body 12, the motor body reaction force $F_b$ causes a pull force $F_d$ to be generated along a radial direction towards a rotational pivot point 40 to maintain the rotational motion of the driving motor body 12. This pull force $F_d$ is generated by the resilient structure, such as the cross-shaped leaf spring assembly 22, and continues to be directed towards the rotational pivot point 40 as the driving motor body 12 moves off-center and further away from the rotational pivot point 40 (see FIG. 6B). Since the resilient structure is located between the driving motor body 12 and the machine base 14, the pull force $F_d$ is primarily in a direction of the machine base 14.

In general, $F_b = F_a = F_{max} \sin \omega t$, where $F_{max}$ is the maximum driving force, $\omega$ is a frequency of a driving command, and t is the duration of application of the driving force.

Figure 7:
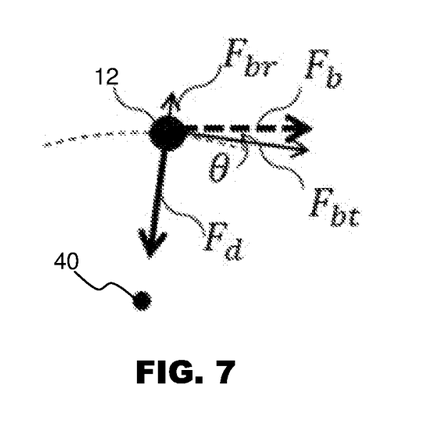
FIG. 7 is a schematic illustration of the generation of a radial force which opposes the driving force.

FIG. 7 is a schematic illustration of the generation of a radial force $F_{br}$ which opposes the driving force. During rotation, the reaction force $F_b$ is resolved into a tangential force $F_{bt}$ (which increases the rotation speed) and a radial force $F_{br}$ (which is in an opposite direction to the pull force $F_d$).

$$F_{br} = F_b \sin\theta \quad F_{bt} = F_b \cos\theta$$
$$F_{bt} = ma \quad v$$
$$F_d - F_{br} - mv^2/r = \int_0^t \frac{F_b \cos\theta}{m} dt = \int_0^t \frac{F_{max}\cos\theta\sin\omega t}{m} dt$$
$$F_d = mv^2/r + F_b\sin\theta = \frac{F_{max}^2(\cos\theta)^2(1-\cos\omega t)^2}{mr\omega^2} + F_{max}\sin\omega t \sin\theta$$

(where m is a mass of the driving motor body, v is a linear velocity during rotation of the driving motor body and a is a linear acceleration during rotation of the driving motor body)

The pull force $F_d$ is thus determined by the driving force, command frequency $\omega$, and the location of the driving motor body 12.

Figure 8A:
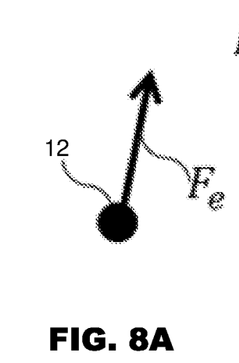
FIGS. 8A and 8B are schematic illustrations of a force transferred to a machine base in a transverse direction to the driving force.
Figure 8B:
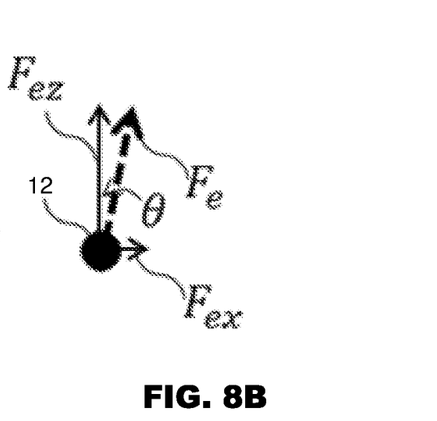

FIGS. 8A and 8B are schematic illustrations of a force transferred to a machine base 14 in a transverse direction to the driving force.

Since the driving motor body 12 and machine base 14 are connected by the resilient structure, such as the cross-shaped leaf spring assembly 22, only the radial force $F_d$ (which is generated by the cross-shaped leaf spring assembly 22) will be transferred to the machine base 14. The force exerted on the machine base $F_e$ is equal to $F_d$ but in an opposite direction. The force exerted on the machine base $F_e$ can be resolved into $F_{ex}$, which is along the motion direction, and $F_{ez}$, which is perpendicular to the motion direction (as in FIG. 8B).

The force transferred to the machine base 14 in the motion direction may then be expressed as per the formula below:

$$F_{ex} = F_d \sin\theta = \frac{F_{max}^2(\cos\theta)^2(1-\cos\omega t)^2 \sin\theta}{mr\omega^2} + F_{max}\sin\omega t(\sin\theta)^2$$

By ensuring that the maximum of $F_{ex}$ is lower than $F_{max}$, as shown below, there will be a reduction in the vibration transmitted:

$$F_{exmax} = \frac{F_{max}^2(\cos\theta)^2\sin\theta}{mr\omega^2} + F_{max}(\sin\theta)^2 < F_{max}$$

The required condition may be obtained after simplifying the above formula:

$$\frac{mr\omega^2}{\sin\theta} > F_{max}$$

Based on the aforesaid required condition, the mass of the motor body in and the radius of rotation r should be as large as possible, and the range of rotation θ should be as small as possible. From the formula obtained from the required condition, it also can be found that vibration reduction will be more effective in respect of a higher frequency command (i.e. having a larger ω) than in respect of a lower frequency command (i.e. having a smaller ω), in order to configure the radial force $F_{br}$ to be as small as possible.

Figure 9A:
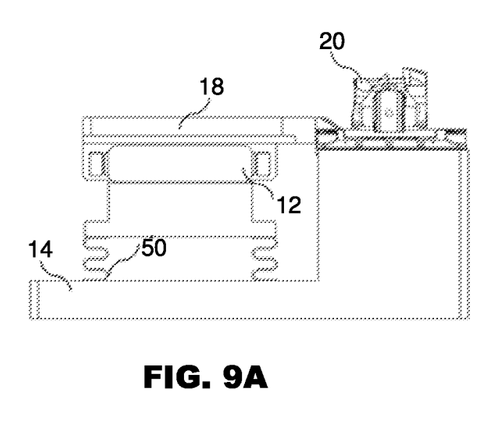
Figure 9B:
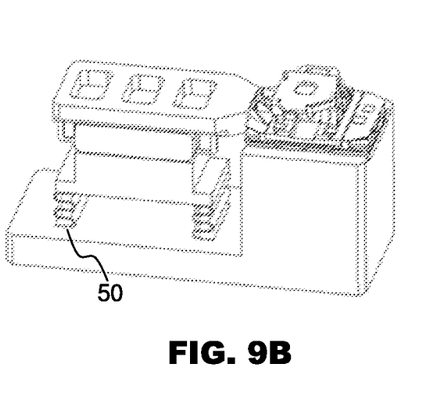

FIGS. 9A to 12B are different examples of resilient structures that may be used in the invention for mounting a driving motor body 12 to achieve a rotary motion of the driving motor body 12. In FIGS. 9A and 9B, the resilient structures are in the form of S-shaped leaf springs 50 to support the driving motor body 12 and to make it rotatable relative to the machine base 14.

Figure 10A:
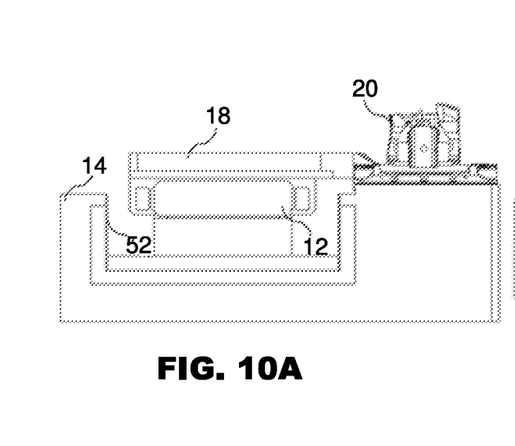
Figure 10B:
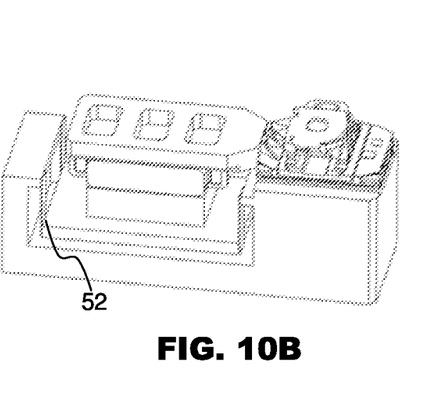

In FIGS. 10A and 10B, the driving motor body 12 is supported by a single leaf spring plate 52, which is arranged to hang the driving motor body 12 and to make it rotatable relative to the machine base 14.

Figure 11A:
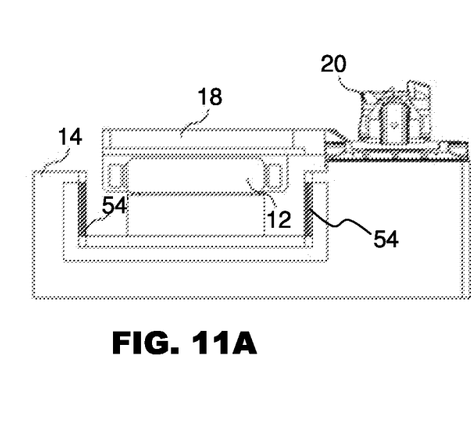
Figure 11B:
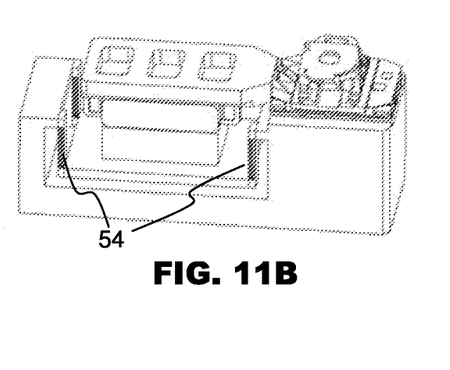

In FIGS. 11A and 11B, the resilient structure is in the form of a multiple leaf spring structure 54. At least two leaf springs are used in the leaf spring structure 54 to support a platform on which the driving motor body 12 is mounted, and to make the driving motor body 12 rotatable relative to the machine base 14.

Figure 12A:
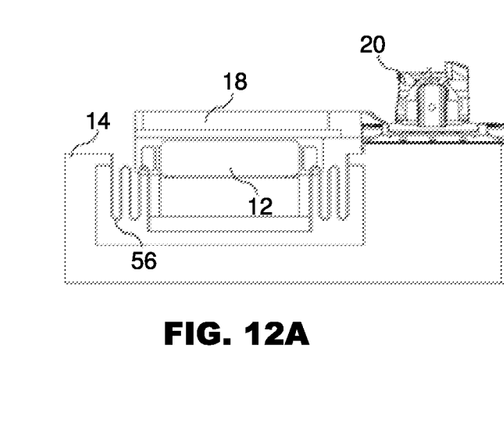
Figure 12B:
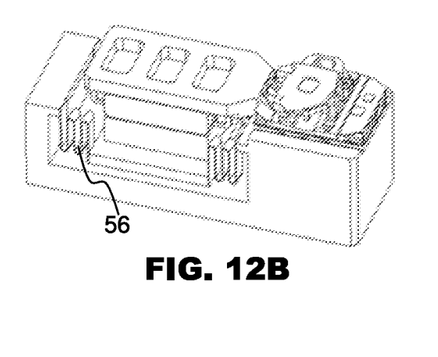

In FIGS. 12A and 12B, S-shaped flexural structures 56 which are arranged horizontally on either side of the driving motor body 12 are used to support the driving motor body 12 and to make the driving motor body 12 rotatable relative to the machine base 14. Each leaf spring in this embodiment has an "S"-shaped cross-section.

It should be appreciated that the motor driving system according to the different embodiments described herein are operative to modify the reaction forces that result from driving forces driving an object to be mostly perpendicular to a motion direction of the object being driven, by converting the reaction force into a pull force. Hence, any transmission of vibration to a machine base 14 in a motion direction is reduced, and any vibration and noise produced by the machine as a whole will correspondingly be significantly decreased.

Moreover, since the force transferred to the machine base 14 is mostly perpendicular to the motion direction instead of being in the motion direction, the aforesaid approach ensures that any adverse effects on a motion accuracy of the object being driven is substantially reduced.

The invention described herein is susceptible to variations, modifications and/or additions other than those specifically described and it is to be understood that the invention includes all such variations, modifications and/or additions which fall within the spirit and scope of the above description.

The invention claimed is:

1. A driving system for reducing vibration transmission from a driving motor to a machine base, the driving system comprising:
   a driving motor body operative to produce a driving force for driving an object to move in reciprocating directions;
   a pivotal support for supporting the driving motor body, the pivotal support being located between the driving motor body and the machine base; wherein the pivotal support is operative to cause at least a portion of
   the driving motor body to rotate relative to the machine base in an opposite direction to a direction of the driving force produced by the driving motor body to drive the object.

2. The driving system as claimed in claim 1, wherein the pivotal support comprises a resilient structure.

3. The driving system as claimed in claim 2, wherein the resilient structure comprises one or more leaf springs.

4. The driving system as claimed in claim 3, wherein the resilient structure comprises a pair of leaf springs that intersect each other at a rotational pivot point that allows the at least a portion of the driving motor body to rotate relative to the machine base about the rotational pivot point.

5. The driving system as claimed in claim 3, wherein a rotational pivot point of the resilient support is a virtual rotational pivot point that allows the at least a portion of the driving motor body to rotate relative to the machine base about the virtual pivot point.

6. The driving system as claimed in claim 5, wherein the one or more leaf springs form a "V" shape, with a base of such "V" shape located at the machine base.

7. The driving system as claimed in claim 3, wherein a rotational pivot point of the resilient support is an infinite pivot point that allows the at least a portion of the driving motor body to rotate relative to the machine base about the infinite pivot point.

8. The driving system as claimed in claim 7, wherein the resilient structure comprises a pair of vertically-arranged leaf springs connecting respective points on the at least a portion of the driving motor body to corresponding positions on the machine base.

9. The driving system as claimed in claim 3, wherein the resilient structure comprises a single leaf spring on which the at least a portion of the driving motor body is arranged to hang.

10. The driving system as claimed in claim 3, wherein the resilient structure comprises one or more leaf springs with an "S"-shaped cross-section.

11. The driving system as claimed in claim 1, wherein the driving motor body comprises a motor driving coil and a motor driving magnet, which are arranged with sufficient space between the motor driving coil and a motor driving magnet in order to maintain a gap between them during rotational motion of the at least a portion of the driving motor body.

12. The driving system as claimed in claim 11, wherein the object is connected to either the motor driving coil or the motor driving magnet for driving the object to move.

13. The driving system as claimed in claim 1, wherein the driving force causes a pull force to be generated in a direction towards a rotational pivot point to maintain rotational motion of the at least a portion of the driving motor body.

14. The driving system as claimed in claim 13, wherein the pull force is directed primarily in a direction of the machine base.

15. The driving system as claimed in claim 1, wherein the object is a bond head of a wire bonder.

* * * * *